United States Patent
Rudeck

(10) Patent No.: US 7,115,458 B2
(45) Date of Patent: Oct. 3, 2006

(54) GATE COUPLING IN FLOATING-GATE MEMORY CELLS

(75) Inventor: Paul J. Rudeck, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 177 days.

(21) Appl. No.: 10/932,954

(22) Filed: Sep. 2, 2004

(65) Prior Publication Data

US 2006/0043458 A1    Mar. 2, 2006

(51) Int. Cl.
*H01L 21/8238* (2006.01)

(52) U.S. Cl. .................. 438/201; 438/257; 438/264; 438/265; 438/266; 438/267; 257/E29.129; 257/E21.179

(58) Field of Classification Search .............. 438/201, 438/257, 264–267
See application file for complete search history.

(56) References Cited

U.S. PATENT DOCUMENTS 6,602,750 B1    8/2003   Kao
2004/0014269 A1*  1/2004   Kim et al. .............. 438/201
2005/0082596 A1*  4/2005   Lin et al. ............... 257/314
2005/0142765 A1*  6/2005   Joo ....................... 438/264
2005/0186739 A1*  8/2005   Wang et al. ............. 438/267
2005/0199939 A1    9/2005   Lutze
2005/0245029 A1* 11/2005   Choi et al. .............. 438/257
2006/0024885 A1    2/2006   Sandhu
2006/0081908 A1    4/2006   Smayling
2006/0121674 A1    6/2006   Jeno et al.

* cited by examiner

*Primary Examiner*—George R. Fourson
*Assistant Examiner*—Thanh V. Pham
(74) *Attorney, Agent, or Firm*—Leffert Jay & Polglaze, PA; Thomas W. Leffert

(57) ABSTRACT

Methods and apparatus utilizing a stepped floating gate structure to facilitate reduced spacing between adjacent cells without significantly impacting parasitic capacitance. The stepped structure results in a reduced surface area of a first floating gate in close proximity to an adjacent floating gate with substantially no reduction in coupling area, thus facilitating a reduction in parasitic capacitance leading to improved gate coupling characteristics. Also, because of the reduced surface area exposed to adjacent floating gates, the floating gates may be formed with reduced spacing, thus further leading to improved gate coupling characteristics.

25 Claims, 4 Drawing Sheets

GATE COUPLING IN FLOATING-GATE MEMORY CELLS

TECHNICAL FIELD OF THE INVENTION

The present invention relates generally to integrated circuit devices and, in particular, to the use of stepped floating gate structures in floating-gate memory cells.

BACKGROUND OF THE INVENTION

Memory devices are typically provided as internal storage areas in the computer. The term memory identifies data storage that comes in the form of integrated circuit chips. In general, memory devices contain an array of memory cells for storing data, and row and column decoder circuits coupled to the array of memory cells for accessing the array of memory cells in response to an external address.

One type of memory is a non-volatile memory known as Flash memory. A flash memory is a type of EEPROM (electrically-erasable programmable read-only memory) that generally can be erased and reprogrammed in blocks. Many modern personal computers (PCs) have their BIOS stored on a flash memory chip so that it can easily be updated if necessary. Such a BIOS is sometimes called a flash BIOS. Flash memory is also popular in wireless electronic devices because it enables the manufacturer to support new communication protocols as they become standardized and to provide the ability to remotely upgrade the device for enhanced features.

A typical flash memory comprises a memory array that includes a large number of memory cells arranged in row and column fashion. Each of the memory cells includes a floating-gate field-effect transistor capable of holding a charge. The cells are usually grouped into blocks. Each of the cells within a block can be electrically programmed by charging the floating gate. The charge can be removed from the floating gate by a block erase operation. The data in a cell is determined by the presence or absence of the charge in the floating gate.

Flash memory typically utilizes one of two basic architectures known as NOR flash and NAND flash. The designation is derived from the logic used to read the devices. In NOR flash architecture, a column of memory cells are coupled in parallel with each memory cell coupled to a bit line. In NAND flash architecture, a column of memory cells are coupled in series with only the first memory cell of the column coupled to a bit line.

Memory device fabricators are continuously seeking to increase performance. One method of increasing performance of a floating-gate memory cell is to increase the coupling of the control gate to the floating gate. A common approach to increasing this coupling is to reduce spacing between adjacent floating gates. Unfortunately, this can lead to increased parasitic coupling of the gate stack.

For the reasons stated above, and for other reasons stated below which will become apparent to those skilled in the art upon reading and understanding the present specification, there is a need in the art for alternate methods and device structures for providing improved gate coupling in floating-gate memory cells.

SUMMARY OF THE INVENTION

The above-mentioned problems with memory devices and other problems are addressed by the present invention and will be understood by reading and studying the following specification.

Various embodiments of the invention utilize a stepped floating gate structure to facilitate reduced spacing between adjacent cells without significantly impacting parasitic capacitance. The stepped structure results in a reduced surface area of a first floating gate in close proximity to an adjacent floating gate with substantially no reduction in coupling area, thus facilitating a reduction in parasitic capacitance leading to improved gate coupling characteristics. Also, because of the reduced surface area exposed to adjacent floating gates, the floating gates may be formed with reduced spacing, thus facilitating increased array density.

For one embodiment, the invention provides a method of fabricating floating-gate memory cells. The method includes forming an isolation region in a semiconductor substrate, forming a tunnel dielectric layer overlying the substrate on opposing sides of the isolation region, and forming a floating-gate layer overlying the tunnel dielectric layer and overlying the isolation region. The method further includes forming a trench in the floating-gate layer overlying the isolation region, wherein the isolation region remains covered by the floating-gate layer after forming the trench; forming spacers on sidewalls of the trench, leaving a portion of the floating-gate layer exposed between the spacers; and removing the exposed portion of the floating-gate layer. The method still further includes forming an intergate dielectric layer overlying the floating-gate layer and forming a control-gate layer overlying the intergate dielectric layer.

For another embodiment, the invention provides a floating-gate memory cell. The memory cell includes a tunnel dielectric layer overlying a semiconductor substrate and interposed between first and second isolation regions and a floating-gate layer overlying the tunnel dielectric layer and at least a portion of the isolation regions. The floating-gate layer includes first and second lower sidewalls overlying the first and second isolation regions, respectively, and first and second upper sidewalls set back from the first and second lower sidewalls, respectively. The memory cell further includes an intergate dielectric layer overlying the floating-gate layer and a control-gate layer overlying the intergate dielectric layer.

The invention further provides methods and apparatus of varying scope.

DETAILED DESCRIPTION OF THE INVENTION

In the following detailed description of the preferred embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process or mechanical changes may be made without departing from the scope of the present invention. The terms wafer and substrate used previously and in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the appended claims and their equivalents.

Figure 1A:
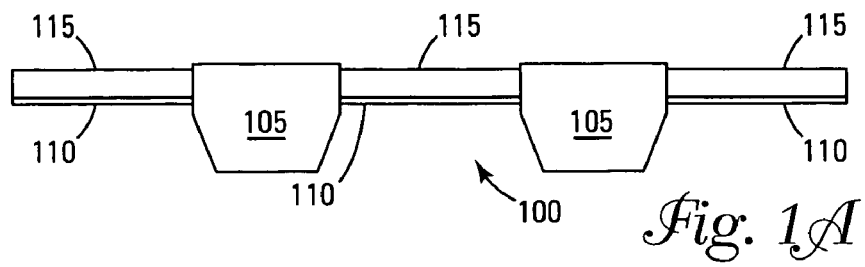
FIGS. 1A–1F are cross-sectional views of a portion of a memory array during various stages of fabrication in accordance with an embodiment of the invention.

FIGS. 1A–1F generally depict a method of forming a portion of a memory array in accordance with one embodiment of the invention. FIG. 1A depicts a portion of the memory array after several processing steps have occurred. Formation of the type of structure depicted in FIG. 1A is well known and will not be detailed herein. In general, FIG. 1A depicts a substrate 100 upon which tunnel dielectric layer 110 and an optional first polysilicon layer 115 have been formed. The tunnel dielectric layer 110 is formed overlying an active region of the substrate 100, over which memory cells will be formed. Isolation regions 105 are formed in the substrate 100. For the embodiment as shown in FIG. 1A, the isolation regions 105 are shallow-trench isolation (STI) regions, commonly formed by creating a trench in the substrate 100 and filling the trench with a dielectric material. For one embodiment, the substrate 100 is a monocrystalline silicon substrate. For a further embodiment, substrate 100 is a P-type monocrystalline silicon substrate.

The tunnel dielectric layer 110 might be formed by thermal oxidation of the silicon substrate 100. Alternatively, the tunnel dielectric layer 110 could be formed by a blanket deposition of a dielectric material, such as by chemical vapor deposition (CVD) or physical vapor deposition (PVD). Tunnel dielectric layer 110 is generally a silicon oxide, but may include other dielectric materials. Some specific examples include silicon oxides ($SiO/SiO_2$), silicon nitrides ($SiN/Si_2N/Si_3N_4$) and silicon oxynitrides ($SiO_xN_y$). The polysilicon layer 115 may be used to form a portion of a floating-gate layer for the future floating-gate memory cells.

Figure 1B:
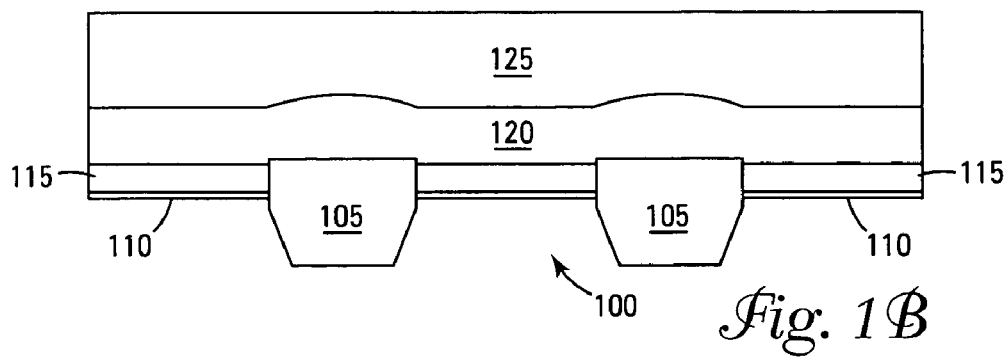

FIG. 1B depicts the formation of a second polysilicon layer 120 and a hard mask layer 125. For one embodiment, the first polysilicon layer 115 and the second polysilicon layer 120 for a floating-gate layer. Typically, the floating-gate layer of a floating-gate memory cell is one or more layers of material capable of storing a charge and is often formed of polysilicon, which also may be conductively doped either during or after formation. While the subsequent processing will refer to polysilicon layers for convenience, it is noted that the invention is not limited to the use of polysilicon for the floating-gate layer of a floating-gate memory cell. In general, hard mask layer 125 is of a material that will be substantially resistant to removal during subsequent processing as described with reference to FIG. 1E, i.e., during removal of a portion of second polysilicon layer 120. For one embodiment, the hard mask layer 125 is a silicon nitride.

Figure 1C:
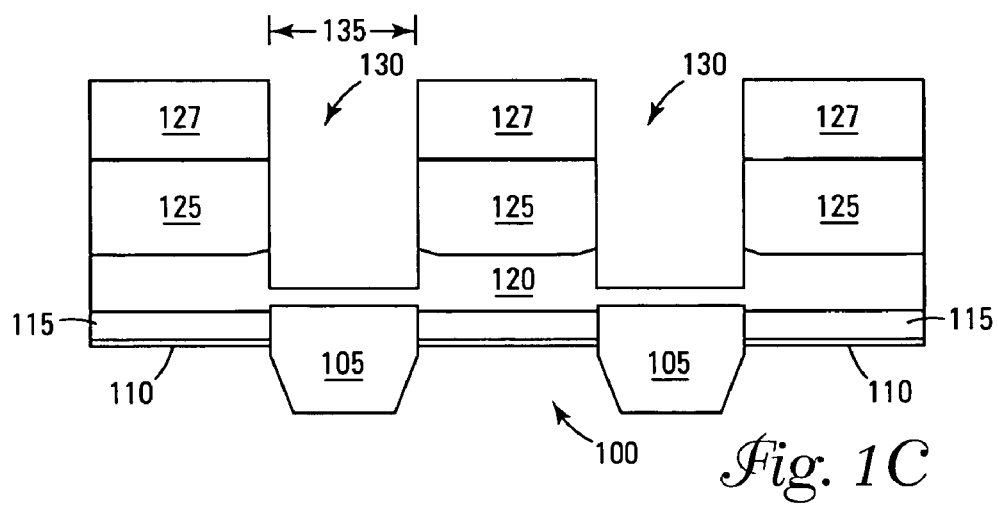

In FIG. 1C, a second mask layer 127 is formed and patterned overlying the hard mask layer 125. Subsequently, portions of the hard mask layer 125 and the second polysilicon layer 120 are removed, leaving the isolation regions 105 covered by the second polysilicon layer 120, i.e., leaving the isolation regions 105 unexposed. As one example, a photolithographic resist material could be deposited overlying the hard mask layer 125, exposed to a radiation source, such as UV light, and developed to define areas 130 overlying the isolation regions 105 for removal of the portions of the hard mask layer 125 and second polysilicon layer 120. For one embodiment, the areas 130 are substantially aligned with edges of the isolation regions 105, thus having a width 135 that is substantially equal to a width of the isolation regions. However, while the areas 130 are defined overlying the isolation regions 105, their width 135 may be greater than or less than a width of the isolation regions 105.

Following this patterning of the second mask layer 127, etches of the hard mask layer 125 and of the second polysilicon layer 120 could then be performed. An etch of the hard mask layer 125 could be selective to the material of the hard mask layer 125, using the second polysilicon layer 120 as a stopping layer. The etch of the second polysilicon layer 120 can be timed to remove some of the exposed portion of the second polysilicon layer 120 without removing all of the exposed portion, thereby forming trenches in the floating-gate layer. Etch rates are generally well known, or easily determined, such that etch times sufficient to remove a portion of the floating-gate layer to bring it to a predetermined thickness can be determined by one skilled in the art. For one embodiment, a thickness of the floating-gate layer in the areas 130 overlying the isolation regions 105 is reduced by approximately half. For a further embodiment, a thickness of the floating-gate layer overlying the isolation regions 105 is reduced to approximately one quarter of its original thickness. In general, reduced thicknesses of this area of the floating-gate layer will facilitate reductions in parasitic capacitance between adjacent memory cells. However, it will be apparent that if thickness is reduced too much, this area of the floating-gate layer will cease to contribute to gate coupling and will thus become counter-productive. Although a minimum thickness will depend upon a number of factors, it is within the skill of the art to balance the competing interests of reducing parasitic capacitance without sacrificing gate coupling characteristics.

Figure 1D:
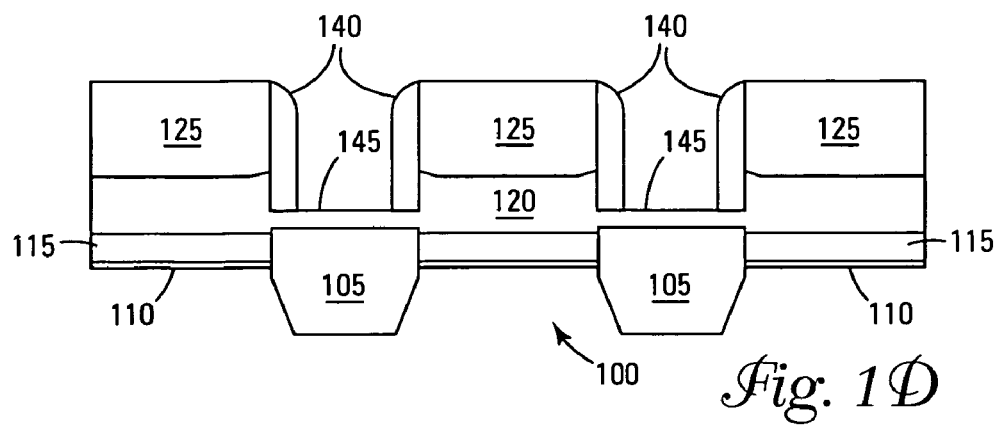

In FIG. 1D, the second mask layer 127 is removed and spacers 140 are formed on sidewalls of the hard mask layer 125 and the second polysilicon layer 120, i.e., on sidewalls of the trench formed in the second polysilicon layer 120, leaving a portion 145 of the second polysilicon layer 120 exposed. Formation of spacers 140 may be carried out using a blanket deposition of some sacrificial material, e.g., silicon nitride, followed by an anisotropic removal to leave vertical spacers on the sidewalls. The portion 145 has a width less than a width of the areas 130 due to the formation of the spacers 140. For one embodiment, the width of portion 145 is approximately ½ or less the width of the areas 130. For a further embodiment, the width of portion 145 is approximately ¼ or less the width of the areas 130.

Figure 1E:
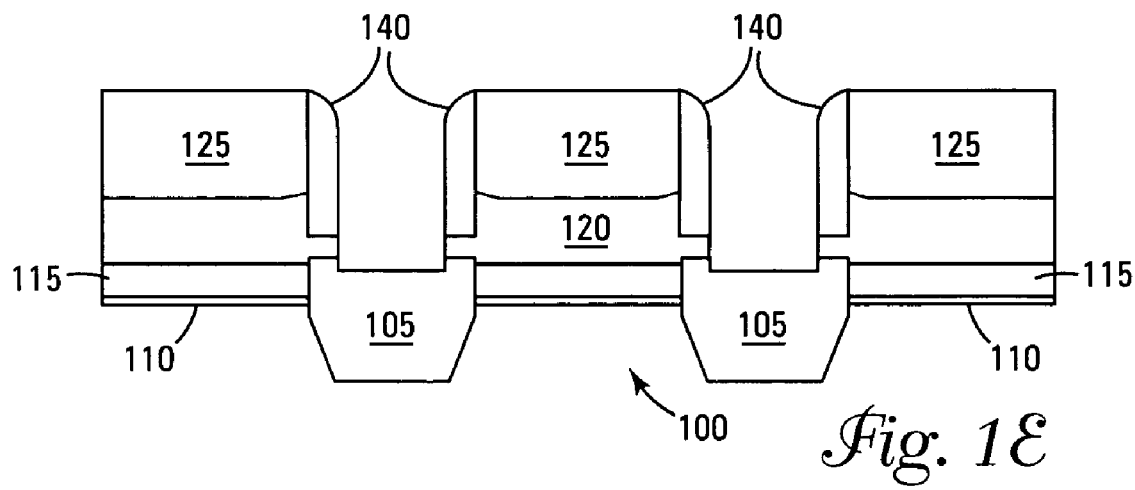
Figure 1F:
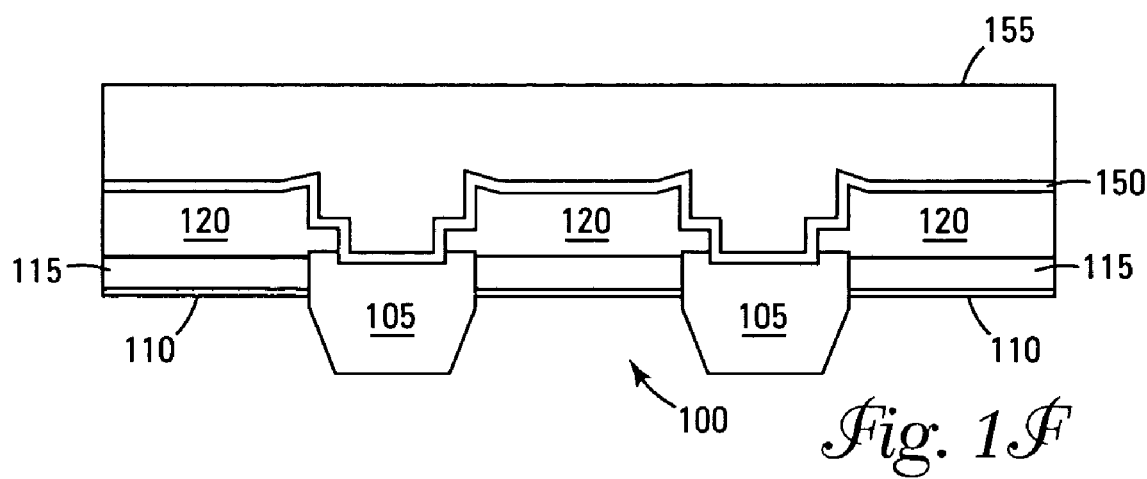

In FIG. 1E, the exposed portion 145 is removed, such as by wet or dry etching. For one embodiment, the portion 145 is removed using a dry etch using the isolation regions 105 as a stopping layer. Alternatively, a portion of the isolation regions 105 may be removed during the removal of the exposed portion 145 of the second polysilicon layer 120, as shown in FIG. 1E. To continue the formation of the array in FIG. 1F, the spacers 140 and hard mask layer 125 are removed. An intergate dielectric layer 150 is formed overlying the floating-gate layer 120. The intergate dielectric layer 150 may be one or more layers of dielectric material. For example, the intergate dielectric layer 150 could be of a multi-layer dielectric material commonly referred to as ONO (oxide-nitride-oxide). Other dielectric materials may be substituted for the ONO, such as tantalum oxide, barium strontium titanate, silicon nitride and other materials providing dielectric properties.

The control gate layer 155 is formed overlying the intergate dielectric layer 150 and patterned to define word lines of the memory device. The control gate layer 155 is generally one or more layers of conductive material. For one embodiment, the control gate layer 155 contains a conductively-doped polysilicon. For a further embodiment, the control gate layer 155 includes a metal-containing layer overlying a polysilicon layer, e.g., a refractory metal silicide layer formed on a conductively-doped polysilicon layer. The metals of chromium (Cr), cobalt (Co), hafnium (Hf), molybdenum (Mo), niobium (Nb), tantalum (Ta), titanium (Ti), tungsten (W), vanadium (V) and zirconium (Zr) are generally recognized as refractory metals. For another embodiment, the control gate layer 155 contains multiple metal-containing layers, e.g., a titanium nitride (TiN) barrier layer overlying the intergate dielectric layer 150, a titanium (Ti) adhesion layer overlying the barrier layer and a tungsten (W) layer overlying the adhesion layer. An insulative cap layer (not shown) is often formed overlying the control gate layer 155 to protect and isolate the control gate from further processing.

It is noted that FIGS. 1A–1F depict a portion of a row of memory cells running parallel to a face plane of the drawings. Columns of memory cells, separated by the isolation regions 105 run perpendicular to the drawings, with source and drain regions formed at opposing ends of the tunnel dielectric layer 110, one above the face plane of the figures and one below the face plane of the figures. It is noted that FIGS. 1A–1F can depict either a NOR-type memory device or a NAND-type memory device, with the differences occurring in the column direction in manners that are well understood in the art of memory fabrication.

Figure 2:
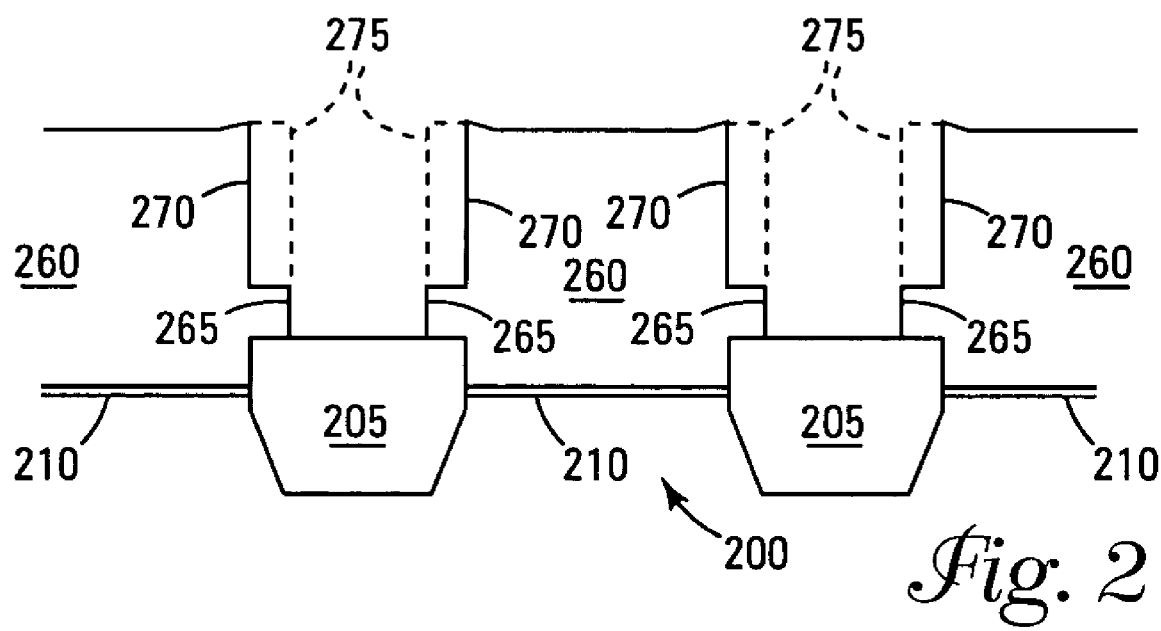
FIG. 2 is a cross-sectional view of a portion of a memory array in accordance with an embodiment of the invention.

FIG. 2 is a cross-sectional view of a portion of an array of memory cells in accordance with an embodiment of the invention. FIG. 2 has been simplified in order to demonstrate how the stepped structure of a floating gate 260, shown in FIG. 2 as a single layer of material, results in the reduced surface area of a first floating gate in close proximity to an adjacent floating gate with substantially no reduction in coupling area. The floating gates 260 are formed overlying tunnel dielectric layers 210, isolation regions 205 and substrate 200. For clarity, the intergate dielectric layer and control-gate layer are not depicted in FIG. 2.

As can be seen from FIG. 2, the lower sidewalls 265 of the floating-gate layers 260 are in close proximity, but the remaining or upper sidewalls 270 are set back, thus reducing the parasitic capacitance that would be seen if the floating-gate layers 260 had the profile depicted by dashed lines 275, with a substantially contiguous sidewall. Similarly, as can be seen in the comparison of the profiles of floating-gate layers 260 and the profiles they would have if no stepped structure were used, i.e., that depicted by dashed lines 275, there is substantially no reduction in coupling area available to the control gate (not shown in FIG. 2). For one embodiment, the lower sidewalls 265 have a height equal to or less than a height of the upper sidewalls 270.

Figure 3:
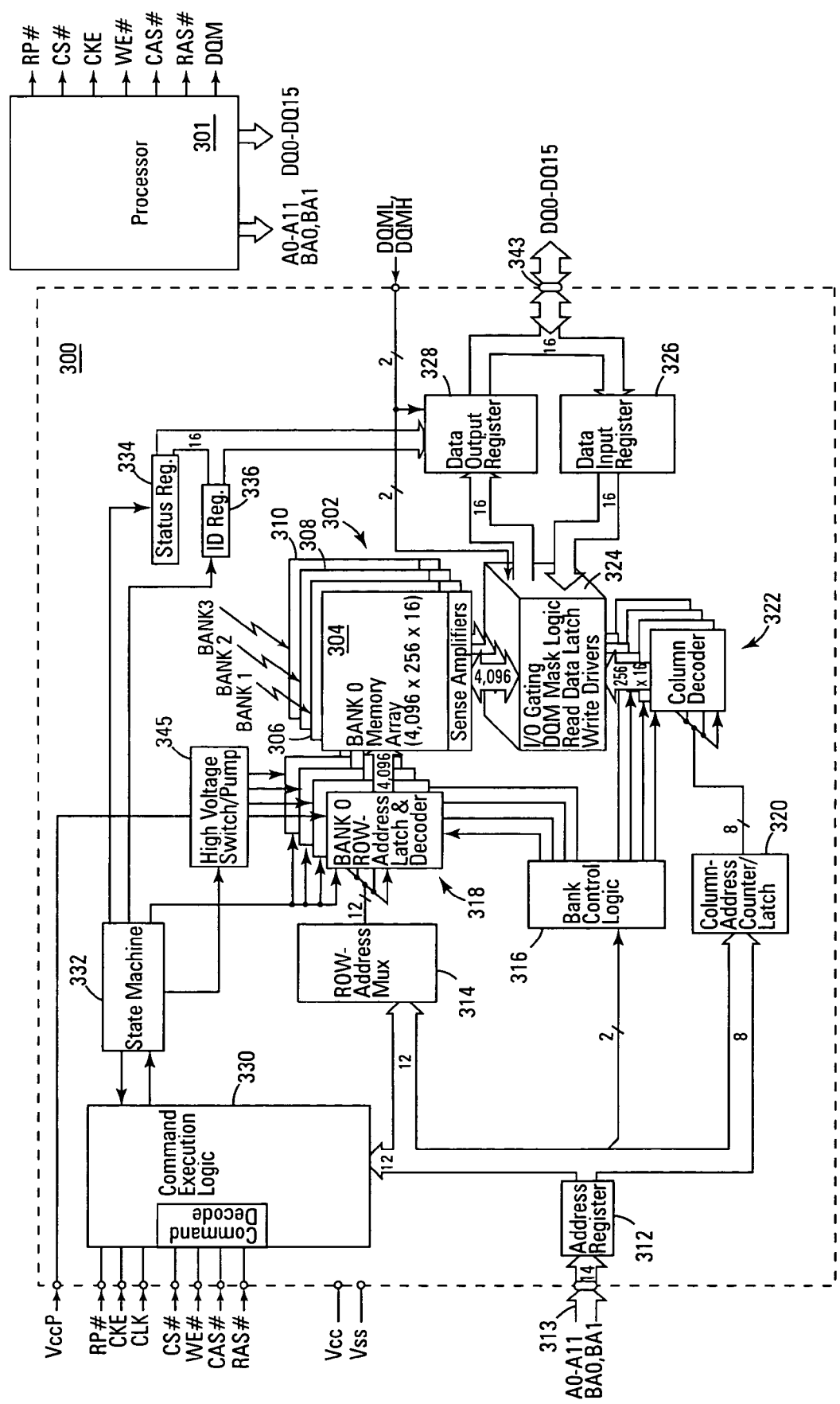
FIG. 3 is a functional block diagram of a basic memory device in accordance with an embodiment of the invention coupled to a processor.

FIG. 3 is a functional block diagram of a basic flash memory device 300 that is coupled to a processor 301. The memory device 300 and the processor 301 may form part of an electronic system. The memory device 300 has been simplified to focus on features of the memory that are helpful in understanding the present invention. The memory device 300 includes an array of non-volatile memory cells 302.

Each memory cell is located at an intersection of a word line and a local bit line. The memory array 302 is arranged in rows and columns, with the rows arranged in blocks. A memory block is some discrete portion of the memory array 302. Individual word lines generally extend to only one memory block while bit lines may extend to multiple memory blocks. The memory cells generally can be erased in blocks. Data, however, may be stored in the memory array 302 separate from the block structure.

The memory array 302 is arranged in a plurality of addressable banks. In one embodiment, the memory contains four memory banks 304, 306, 308 and 310. Each memory bank contains addressable sectors of memory cells. The data stored in the memory can be accessed using externally provided location addresses received by address register 312 from processor 301 on address lines 313. The addresses are decoded using row address multiplexer circuitry 314. The addresses are also decoded using bank control logic 316 and row address latch and decode circuitry 318.

To access an appropriate column of the memory, column address counter and latch circuitry 320 couples the received addresses to column decode circuitry 322. Circuit 324 provides input/output gating, data mask logic, read data latch circuitry and write driver circuitry. Data is input through data input registers 326 and output through data output registers 328. This bi-directional data flow occurs over data (DQ) lines 343.

Command execution logic 330 is provided to control the basic operations of the memory device including memory read operations. A state machine 332 is also provided to control specific operations performed on the memory arrays and cells. A high voltage switch and pump circuit 345 is provided to supply higher voltages during erase and write operations. A status register 334 and an identification register 336 can also be provided to output data.

The memory device 300 can be coupled to an external memory controller, or processor 301, to receive access commands such as read, write and erase command. Other memory commands can be provided, but are not necessary to understand the present invention and are therefore not outlined herein. The memory device 300 includes power supply inputs Vss and Vcc to receive lower and upper voltage supply potentials.

As stated above, the flash memory device 300 has been simplified to facilitate a basic understanding of the features of the memory device. A more detailed understanding of flash memories is known to those skilled in the art. As is well known, such memory devices 300 may be fabricated as integrated circuits on a semiconductor substrate.

CONCLUSION

Methods and apparatus have been described utilizing a stepped floating gate structure to facilitate reduced spacing between adjacent cells without significantly impacting parasitic capacitance. The stepped structure results in a reduced surface area of a first floating gate in close proximity to an adjacent floating gate with substantially no reduction in coupling area, thus facilitating a reduction in parasitic capacitance leading to improved gate coupling characteristics. Also, because of the reduced surface area exposed to adjacent floating gates, the floating gates may be formed with reduced spacing, thus facilitating increased array density.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of fabricating floating-gate memory cells, comprising:

forming an isolation region in a semiconductor substrate;
    forming a tunnel dielectric layer overlying the substrate on opposing sides of the isolation region;
    forming a floating-gate layer overlying the tunnel dielectric layer and overlying the isolation region;
    forming a trench in the floating-gate layer overlying the isolation region, wherein the isolation region remains covered by the floating-gate layer after forming the trench;
    forming spacers on sidewalls of the trench, leaving a portion of the floating-gate layer exposed between the spacers;
    removing the exposed portion of the floating-gate layer to expose a portion of the isolation region;
    forming an intergate dielectric layer overlying the floating-gate layer; and
    forming a control-gate layer overlying the intergate dielectric layer.

2. The method of claim 1, wherein forming an isolation region further comprises forming a shallow trench isolation region.

3. The method of claim 1, wherein forming a tunnel dielectric layer overlying the substrate further comprises growing the tunnel dielectric layer on the substrate.

4. The method of claim 1, wherein forming a floating-gate layer overlying the tunnel dielectric layer and overlying the isolation region further comprises forming a first layer overlying and adjoining the tunnel dielectric layer and forming a second layer overlying and adjoining the first layer and the isolation region.

5. The method of claim 4, further comprising forming the second layer overlying and adjoining a second isolation region, wherein the isolation region and the second isolation region are formed on opposing sides of the tunnel dielectric layer.

6. The method of claim 1, wherein forming a trench in the floating-gate layer overlying the isolation region further comprises:

forming a hard mask layer overlying the floating-gate layer;
    forming and patterning a second mask layer overlying the hard mask layer, thereby exposing a first area of the hard mask layer overlying the isolation region;
    removing the exposed first area of the hard mask layer, thereby exposing a first area of the floating-gate layer overlying the isolation region; and
    removing less than an entire thickness of the floating-gate layer in the exposed first area of the floating-gate layer.

7. The method of claim 6, wherein removing less than an entire thickness of the floating-gate layer in the exposed first area of the floating-gate layer further comprises etching the exposed first area of the floating-gate layer for a predetermined period of time.

8. The method of claim 6, wherein removing less than an entire thickness of the floating-gate layer in the exposed first area of the floating-gate layer further comprises removing ½ or more of the thickness of the floating-gate layer.

9. The method of claim 8, wherein removing less than an entire thickness of the floating-gate layer in the exposed first area of the floating-gate layer further comprises removing approximately ¾ of the thickness of the floating-gate layer.

10. The method of claim 1, wherein forming spacers on sidewalls of the trench further comprises forming a layer of material overlying the floating-gate layer and anisotropically removing horizontal portions of the layer of material.

11. The method of claim 10, wherein a patterned hard mask layer is overlying the floating-gate layer and the layer of material is formed overlying the hard mask layer and the floating-gate layer.

12. The method of claim 1, wherein removing the exposed portion of the floating-gate layer further comprises removing the exposed portion of the floating-gate layer using the isolation region as a stopping layer.

13. A method of forming a floating-gate memory cell, comprising:

forming a tunnel dielectric layer overlying an active region of a semiconductor substrate interposed between two isolation regions;
    forming a floating-gate layer overlying the isolation regions and the tunnel dielectric layer;
    removing a first portion of the floating-gate layer overlying a first of the isolation regions, wherein the first isolation region remains covered by the floating-gate layer after removing the first portion of the floating-gate layer;
    removing a second portion of the floating-gate layer overlying a second of the isolation regions, wherein the second isolation region remains covered by the floating-gate layer after removing the second portion of the floating-gate layer;
    removing a third portion of the floating-gate layer overlying the first isolation region to expose a portion of the first isolation region;
    removing a fourth portion of the floating-gate layer overlying the second isolation region to expose a portion of the second isolation region;
    forming an intergate dielectric layer overlying the floating-gate layer and the isolation regions; and
    forming a control-gate layer overlying the intergate dielectric layer.

14. The method of claim 13, further comprising:

forming the two isolation regions on opposing sides of the active region of the substrate by forming two trenches in the substrate and filling the trenches with dielectric material.

15. The method of claim 13, wherein forming a floating-gate layer overlying the isolation regions and the tunnel dielectric layer further comprises forming a first polysilicon layer overlying the tunnel dielectric layer and forming a second polysilicon layer overlying the first polysilicon layer and the isolation regions.

16. The method of claim 13, wherein removing a first portion of the floating-gate layer overlying a first of the isolation regions further comprises forming a trench in the floating-gate layer.

17. The method of claim 16, wherein the trench has a width substantially equal to a width of the first isolation region.

18. The method of claim 17, wherein the trench has a depth equal to approximately ½ or more of a thickness of the floating-gate layer overlying the first isolation region prior to removing the first portion of the floating-gate layer.

19. The method of claim 13, wherein removing a second portion of the floating-gate layer overlying a second of the isolation regions further comprises forming a trench in the floating-gate layer.

20. The method of claim 19, wherein the trench has a width substantially equal to a width of the second isolation region.

21. The method of claim 20, wherein the trench has a depth equal to approximately ½ or more of a thickness of the floating-gate layer overlying the second isolation region prior to removing the second portion of the floating-gate layer.

22. The method of claim 13, wherein removing a third portion of the floating-gate layer overlying the first isolation region to expose a portion of the first isolation region further comprises etching the third portion of the floating-gate layer using the first isolation region as a stopping layer and wherein removing a fourth portion of the floating-gate layer overlying the second isolation region to expose a portion of the second isolation region further comprises etching the fourth portion of the floating-gate layer using the second isolation region as a stopping layer.

23. The method of claim 13, wherein the third portion of the floating-gate layer has a width less than a width of the first portion of the floating-gate layer and wherein the fourth portion of the floating-gate layer has a width less than a width of the second portion of the floating-gate layer.

24. The method of claim 13, wherein the width of the third portion of the floating-gate layer is approximately ½ or less the width of the first portion of the floating-gate layer and the width of the fourth portion of the floating-gate layer is approximately ½ or less the width of the second portion of the floating-gate layer.

25. The method of claim 13, wherein the width of the third portion of the floating-gate layer is approximately ⅓ or less the width of the first portion of the floating-gate layer and the width of the fourth portion of the floating-gate layer is approximately ⅓ or less the width of the second portion of the floating-gate layer.

* * * * *